United States Patent
Li et al.

(10) Patent No.: US 11,222,586 B2
(45) Date of Patent: Jan. 11, 2022

(54) DISPLAY PANEL, MANUFACTURING METHOD THEREOF, AND DISPLAY DEVICE

(71) Applicant: BOE TECHNOLOGY GROUP CO., LTD., Beijing (CN)

(72) Inventors: Dong Li, Beijing (CN); Hongwei Tian, Beijing (CN); Xiaolong Li, Beijing (CN); Shuai Zhang, Beijing (CN); Chunyang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 64 days.

(21) Appl. No.: 16/632,169

(22) PCT Filed: May 14, 2019

(86) PCT No.: PCT/CN2019/086839
§ 371 (c)(1),
(2) Date: Jan. 17, 2020

(87) PCT Pub. No.: WO2020/113908
PCT Pub. Date: Jun. 11, 2020

(65) Prior Publication Data
US 2021/0225280 A1 Jul. 22, 2021

(30) Foreign Application Priority Data
Dec. 7, 2018 (CN) .......................... 201811497550.3

(51) Int. Cl.
*G09G 3/3266* (2016.01)
*G09G 3/3233* (2016.01)
*H01L 27/32* (2006.01)
*H01L 51/00* (2006.01)
(Continued)

(52) U.S. Cl.
CPC ......... *G09G 3/3233* (2013.01); *G09G 3/3266* (2013.01); *G09G 3/3275* (2013.01);
(Continued)

(58) Field of Classification Search
CPC ......... G09G 3/3233; G09G 2320/0204; G09G 2380/02; H01L 27/32; H01L 51/0097; H01L 51/56
(Continued)

(56) References Cited

U.S. PATENT DOCUMENTS

| 8,914,143 B1 | 12/2014 | Kaskey et al. |
| 2003/0222537 A1* | 12/2003 | Chou ................. H05B 41/2822 310/318 |

(Continued)

FOREIGN PATENT DOCUMENTS

| CN | 108364602 A | 12/2014 |
| CN | 105573555 A | 5/2016 |

(Continued)

OTHER PUBLICATIONS

International Search Report Issued in Application No. PCT/CN2019/086839 dated Aug. 28, 2019, (10p).
(Continued)

*Primary Examiner* — Abdul-Samad A Adediran
(74) *Attorney, Agent, or Firm* — Arch & Lake LLP

(57) ABSTRACT

A display panel is disclosed. The display panel includes a flexible substrate; a display sub-region on the flexible substrate including a light emitting device; a peripheral region of the display sub-region spacing the display sub-region from an adjacent display sub-region; and a current compensator in the peripheral region for compensating a current flowing through the light emitting device of the display sub-region in response to deformation of the flexible substrate.

19 Claims, 9 Drawing Sheets

(51) Int. Cl.
*H01L 51/56* (2006.01)
*G09G 3/3275* (2016.01)
(52) U.S. Cl.
CPC .......... *H01L 27/32* (2013.01); *H01L 51/0097* (2013.01); *H01L 51/56* (2013.01); *G09G 2320/0204* (2013.01); *G09G 2380/02* (2013.01)
(58) Field of Classification Search
USPC ............................................ 310/318; 345/76
See application file for complete search history.

(56) References Cited

U.S. PATENT DOCUMENTS

2014/0362304 A1   12/2014   Wang et al.
2015/0325168 A1*  11/2015   Nakagawa ........... G09G 3/3216
                                                         345/76
2018/0088736 A1   3/2018    Jeong et al.
2019/0057649 A1*  2/2019    Takizawa ............ G09G 3/3266

FOREIGN PATENT DOCUMENTS

| | | |
|---|---|---|
| CN | 106328061 A | 1/2017 |
| CN | 106663406 A | 5/2017 |
| CN | 106910842 A | 6/2017 |
| CN | 107331300 A | 11/2017 |
| CN | 108346622 A | 7/2018 |
| CN | 108447433 A | 8/2018 |
| CN | 109445159 A | 3/2019 |
| JP | 2007048237 A | 2/2007 |

OTHER PUBLICATIONS

First Office Action to Chinese Application No. 201811497550.3 dated Jul. 3, 2020 with English translation, (19p).

* cited by examiner

DISPLAY PANEL, MANUFACTURING METHOD THEREOF, AND DISPLAY DEVICE

CROSS-REFERENCE TO RELATED APPLICATIONS

This application is the U.S. national phase of PCT Patent Application No. PCT/CN2019/086839 filed on May 14, 2019, which claims the priority of Chinese Patent Application No. 201811497550.3, filed on Dec. 7, 2018, the entire content of both of which is incorporated herein by reference in their entirety for all purposes.

TECHNICAL FIELD

The present disclosure relates to the field of display technologies, and in particular, to a display panel, a manufacturing method thereof, and a display device.

BACKGROUND

An organic light emitting diode (OLED) is a current-type light emitting device, and can be fabricated on a flexible substrate to manufacture a flexible display panel.

In a stretching process of the flexible display panel, the display area of the display panel may be increased, but the number of OLEDs in the display panel is not increased, thereby causing the overall brightness of the display panel to decrease after stretching.

SUMMARY

Embodiments of the present disclosure provide a display panel, a manufacturing method thereof, and a display device.

According to a first aspect of the present disclosure, there is provided a display panel, including: a flexible substrate; a display sub-region on the flexible substrate including a light emitting device; a peripheral region of the display sub-region spacing the display sub-region from an adjacent display sub-region; and a current compensator in the peripheral region for compensating a current flowing through the light emitting device of the display sub-region in response to deformation of the flexible substrate.

The display panel may further include a plurality of the display sub-regions in an array arrangement, and a plurality of the peripheral regions, each spacing one of the display sub-regions from an adjacent display sub-region.

Each display sub-region may include a single sub-pixel with one light emitting device electrically connected to the current compensator.

Each display sub-region may include a plurality of sub-pixels, each having a light emitting device electrically connected to the current compensator.

The display panel may further include: a plurality of the current compensators in the peripheral region; and an arithmetic circuit configured to acquire an average compensation current of at least two of the current compensators, and to supply the average compensation current to the light emitting device.

The current compensator may include a piezo film.

The display panel may further include a first lead and a second lead insulated from each other; a first end of the piezo film may be electrically connected to a first electrode of the light emitting device through the first lead; a second end of the piezo film may be electrically connected to a second electrode of the light emitting device through the second lead; and the first electrode of the light emitting device may be closer to the flexible substrate with respect to the second electrode of the light emitting device.

The display panel may further include a first insulating layer on the flexible substrate, the first insulating layer being located on a side of the piezo film away from the flexible substrate; a first via hole on the first insulating layer, wherein the first lead electrically connects the first end of the piezo film to the first electrode of the light emitting device through the first via hole; and a second via hole on the first insulating layer, wherein the second lead electrically connects the second end of the piezo film to the second electrode of the light emitting device through the second via hole.

The second lead may include an adapting lead and a sub-lead electrically connected with each other, the adapting lead being in the second via hole; the adapting lead may be of a same material as the first electrode of the light emitting device; and the sub-lead may be of a same material as the second electrode of the light emitting device.

The piezo film may be a piezorelectric film.

The piezoelectric film may be configured to generate a positive compensation current in a stretched state; a first end of the piezoelectric film may be electrically connected to the first electrode of the light emitting device; and a second end of the piezoelectric film may be electrically connected to the second electrode of the light emitting device. The positive compensation current may be in a same direction as a current driving the light emitting device.

The piezoelectric film may be configured to generate a negative compensation current in a stretched state; a first end of the piezoelectric film may be electrically connected to the second electrode of the light emitting device; and a second end of the piezoelectric film may be electrically connected to the first electrode of the light emitting device. The negative compensation current may be in a direction opposite to a current driving the light emitting device.

The piezo film may be a piezoresistive film that has an increased resistance in a stretched state.

The piezoresistive film may be patterned into a block area.

The piezoresistive film may be a piezoresistive lead; and a length of the piezoresistive lead may be greater than a distance between orthographic projections of the first lead and the second lead on the flexible substrate.

The display panel may further include a second insulating layer on the flexible substrate, the second insulating layer being located on a side of the piezo film close to the flexible substrate.

At least one of the first and second insulating layers may be made of an organic material.

According to a second aspect of the present disclosure, there is provided a display device, including the above display panel.

According to a third aspect of the present disclosure, there is provided a method of manufacturing a display panel, the method including: providing a flexible substrate; forming a display sub-region on the flexible substrate comprising a light emitting device; forming a peripheral region of the display sub-region spacing the display sub-region from an adjacent display sub-region; and forming a current compensator in the peripheral region for compensating a current flowing through the light emitting device of the display sub-region in response to deformation of the flexible substrate.

The current compensator may include a piezo film; and the method may further include: forming a first insulating layer on the flexible substrate on which the piezo film is formed; forming a first via hole and a second via hole on the first insulating layer by a patterning process; forming a first lead while forming a first electrode of the light emitting device, wherein the first lead electrically connects a first end of the piezo film and the first electrode of the light emitting device through the first via hole; and forming a second lead comprising an adapting lead and a sub-lead. The second lead may be formed by forming the adapting lead in the second via hole while forming the first electrode of the light emitting device, and forming the sub-lead electrically connected to the adapting lead while forming a second electrode of the light emitting device; and the second lead may electrically connect a second end of the piezo film to the second electrode of the light emitting device through the second via hole.

BRIEF DESCRIPTION OF THE DRAWINGS

A more particular description of the embodiments will be rendered by reference to specific embodiments illustrated in the appended drawings. Given that these drawings depict only some embodiments and are not therefore considered to be limiting in scope, the embodiments will be described and explained with additional specificity and details through the use of the accompanying drawings, in which:

FIG. 3a is a schematic diagram showing connections between a plurality of light emitting devices in a same display sub-region and a current compensator in FIG. 2a;

FIG. 8b is an equivalent circuit diagram of FIG. 8a;

FIG. 9b is an equivalent circuit diagram of FIG. 9a;

DETAILED DESCRIPTION

Figure 1:
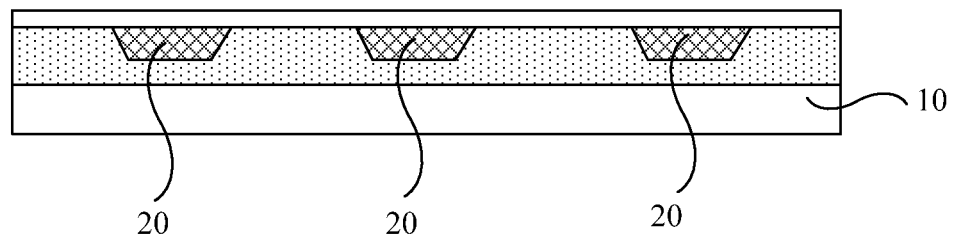
FIG. 1 is a schematic cross-sectional view of a display panel according to some embodiments of the present disclosure.

The disclosure will be described hereinafter with reference to the accompanying drawings, which illustrate embodiments of the disclosure. The described embodiments are only exemplary embodiments of the present disclosure, but not all embodiments. Other variations may be derivable by a person of ordinary skill in the art based on the embodiments of the present disclosure without creative efforts, and are within the scope of the present disclosure.

References throughout the disclosure to "one embodiment", "an embodiment", "an example", "some embodiments", or similar language mean that a particular feature, structure, or characteristic described in connection with the embodiment is included in at least one embodiment. Thus, appearances of the phrases "in one embodiment", "in an embodiment", "in some embodiments", and similar language throughout the disclosure may, but do not necessarily, all refer to the same embodiment(s), but mean "one or more embodiments". These may or may not include all the embodiments disclosed. Accordingly, features or elements of some embodiments may be available in some other embodiments unless the context indicates otherwise.

Unless otherwise defined, technical terms or scientific terms used in the embodiments of the present disclosure should be construed in the ordinary meaning of the person of ordinary skill in the art.

The terms "first", "second" and similar terms used in the present disclosure do not denote any order, quantity, or importance. They are merely used for references to relevant devices, components, procedural steps, etc. These terms do not imply any spatial or chronological orders, unless expressly specified otherwise. For example, a "first device" and a "second device" may refer to two separately formed devices, or two parts or components of the same device. In some cases, for example, a "first device" and a "second device" may be identical, and may be named arbitrarily. Similarly, a "first step" of a method or process may be carried or performed before, after, or simultaneously with, a "second step".

The terms "comprising", "including", "having", and variations thereof mean "including but not limited to", unless expressly specified otherwise.

An enumerated listing of items does not imply that any or all of the items are mutually exclusive, unless expressly specified otherwise. The terms "a", "an", and "the" also refer to "one or more" unless expressly specified otherwise.

The words "connected" or "connection" and the like are not limited to physical or mechanical connections, but may include electrical connections, whether direct or indirect.

The word "over" is used only to indicate that a layer's relative position with respect to another layer, which means that the layer is located further from the substrate than the other. This does not necessarily require contact of the two layers, nor does it require the layer fully or partially covering the other layer.

The words "above", "below", "under", "left", "right", etc. may be used to refer to relative positions of an element under normal operation mode or installation orientation, to facilitate understanding of the relevant embodiments. The scope of the disclosure is not limited to the specific operation mode or installation orientation as described.

Figure 2A:
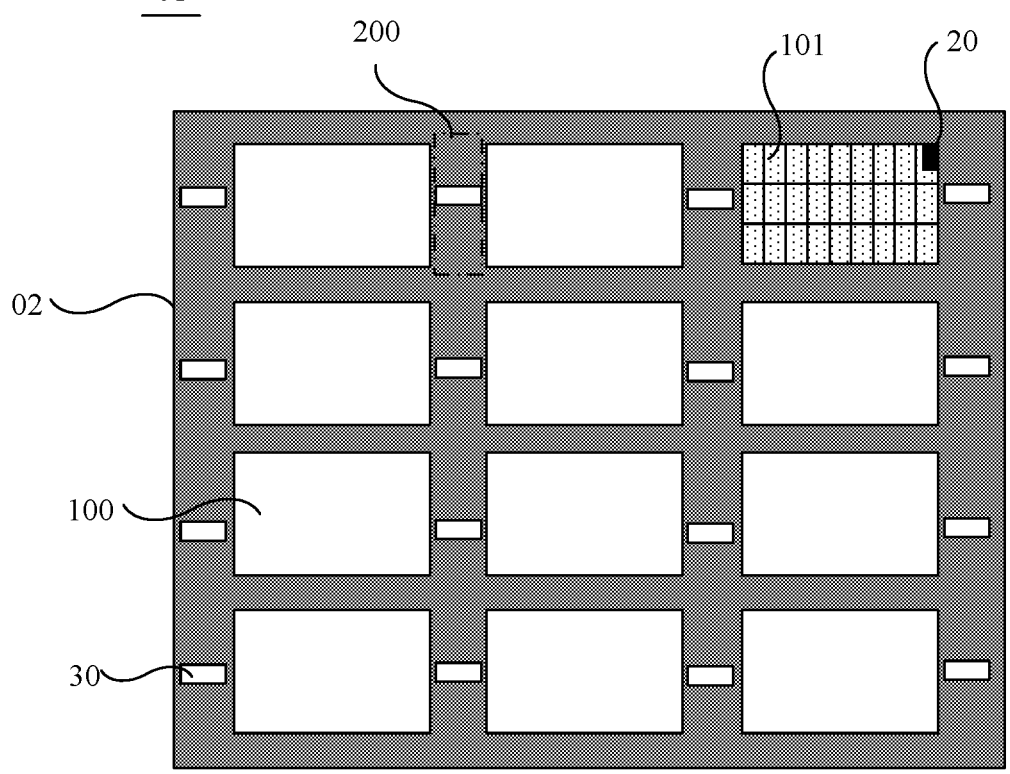
FIG. 2a is a schematic top view of a display panel according to some embodiments of the present disclosure.

Some embodiments of the present disclosure provide a display panel. As shown in FIG. 1 and FIG. 2a, the display panel 01 includes: a flexible substrate 10; a display sub-region 100 on the flexible substrate 10 including a light emitting device 20; a peripheral region 200 of the display sub-region 100 spacing the display sub-region 100 from an adjacent display sub-region; and a current compensator 30 in the peripheral region for compensating a current flowing through the light emitting device 20 in response to deformation of the flexible substrate 10. The peripheral region 200 may be a rectangular area on one side of the display sub-region 100 as shown in FIG. 2a, or alternatively, it may be an annular area or a rectangular loop around the display sub-region 100. One peripheral region 200 may be shared between two adjacent display sub-regions 100.

The display panel 01 as shown in FIG. 1 includes the flexible substrate 10 and a plurality of the light emitting devices 20 disposed on the flexible substrate 10.

The material constituting the flexible substrate 10 may be a light transmissive or opaque flexible resin material. The display panel 01 is a flexible display panel. In this case, the display panel 01 can be stretched and bent by an external force.

The light emitting device 20 may be a light emitting diode (LED) or an organic light-emitting diode (OLED).

Further, as shown in FIG. 2a, the display area 02 of the display panel 01, that is, the area where an image is displayed, may be divided into a plurality of display sub-regions 100. The plurality of the display sub-regions 100 may be in an array arrangement. At least one sub-pixel 101 is disposed within each display sub-region 100, that is, each display sub-region may include one sub-pixel or a plurality of sub-pixels.

Figure 3A:
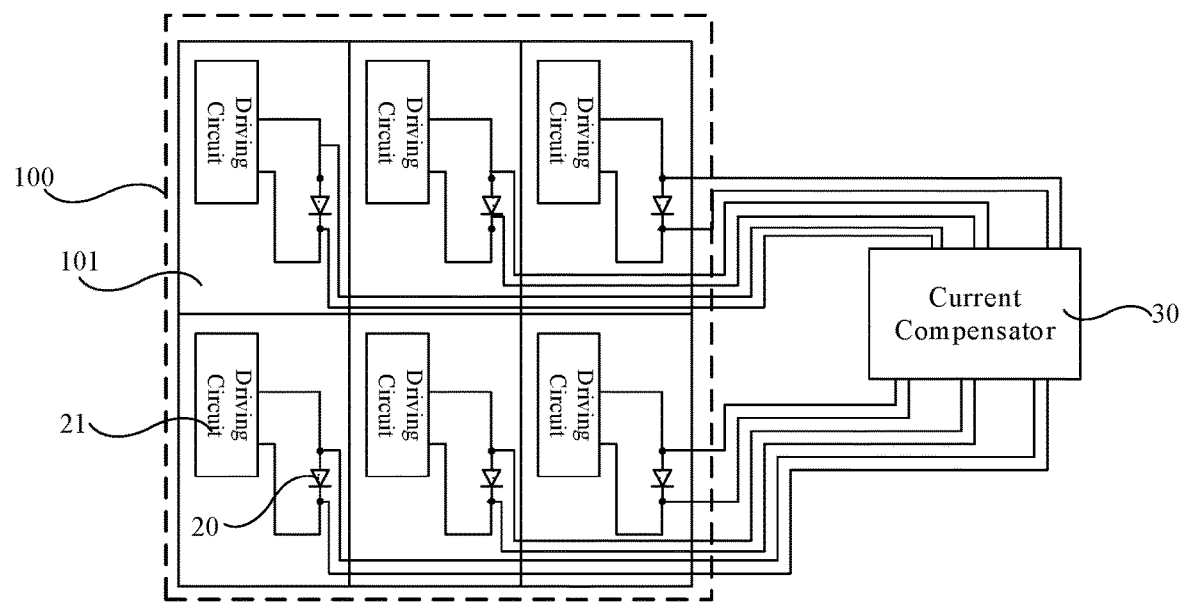
Figure 3B:
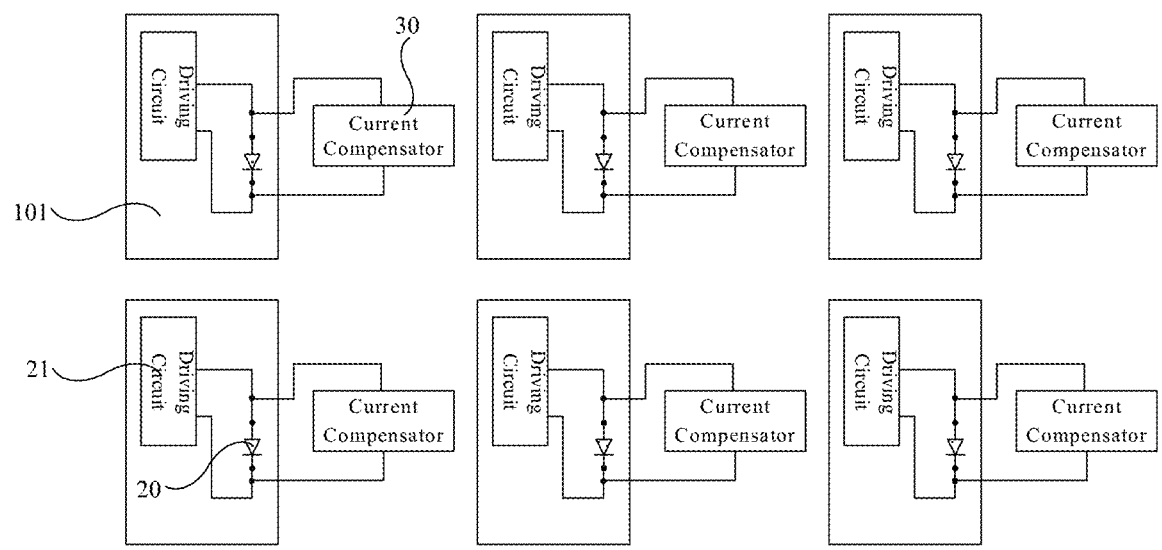
FIG. 3b is a schematic diagram showing a connection of the light emitting device of each sub-pixel and a corresponding current compensator, when each display sub-region in FIG. 2a includes only one sub-pixel.

Each of the sub-pixels 101 is provided with a light emitting device 20 as described above and a driving circuit 21 for driving the light emitting device 20 to emit light (as shown in FIG. 3a or FIG. 3b). The driving circuit 21 provides a driving current to the light emitting device 20. The driving circuit 21 includes a plurality of transistors and at least one capacitor. For example, the driving circuit 21 may have a 2T1C (i.e., two transistors, and one capacitor) structure. Alternatively, the function of the driving circuit may be enhanced according to the user requirement. For example, the function of compensating the threshold voltage of the driving transistor in the driving circuit 21 may be added. In this case, it may need to increase the number of transistors in the driving circuit 21. The present disclosure does not limit the structure of the driving circuit 21.

In addition, the display panel 01 may include a plurality of current compensators 30 on the flexible substrate 10 in an array arrangement as shown in FIG. 2a. Each of the current compensators 30 is located in the display area 02.

On this basis, as shown, at least one of the current compensators 30 is disposed in the peripheral region 200 of each display sub-region 100.

In some embodiments, a plurality of peripheral regions 200 may be provided, each spacing one display sub-region 100 from an adjacent display sub-region, and each peripheral region 200 may be provided with a current compensator 30.

In some other embodiments, the display area 02 may include only two display sub-regions 100 spaced, or separated, by one peripheral region 200, in which a current compensator 30 is located.

Further, as shown in FIG. 3a, in the display sub-region 100 including a plurality of sub-pixels 101, the light emitting devices 20 in the respective sub-pixels 101 are electrically connected to at least one current compensator 30 located in the peripheral region 200 of the display sub-region 100. That is, each display sub-region 100 includes a plurality of sub-pixels 101, each having a light emitting device 20 electrically connected to the current compensator 30.

When only one sub-pixel 101 is disposed in each display sub-region 100, as shown in FIG. 3b, the light emitting device 20 in each sub-pixel 101 is electrically connected to at least one current compensator 30 located around the sub-pixel 101 or in the peripheral region 200 of the display sub-region 100. That is, each display sub-region 100 includes a single sub-pixel 101 with one light emitting device 20 electrically connected to the current compensator 30.

The current compensator 30 is electrically connected to the light emitting device 20 in such a manner that the current compensator 30 is electrically connected to the anode and the cathode of the light emitting device 20, respectively.

In this case, when the display panel 01 is stretched, the current compensator 30 is used to compensate the current flowing through the light emitting device 20 electrically connected to the current compensator 30 according to the tensile deformation, or the extent of stretch deformation, of the flexible substrate 10. That is, the current compensator 30 provides a compensation current to the light emitting device 20 when the flexible substrate 10 is stretched.

Figure 4:
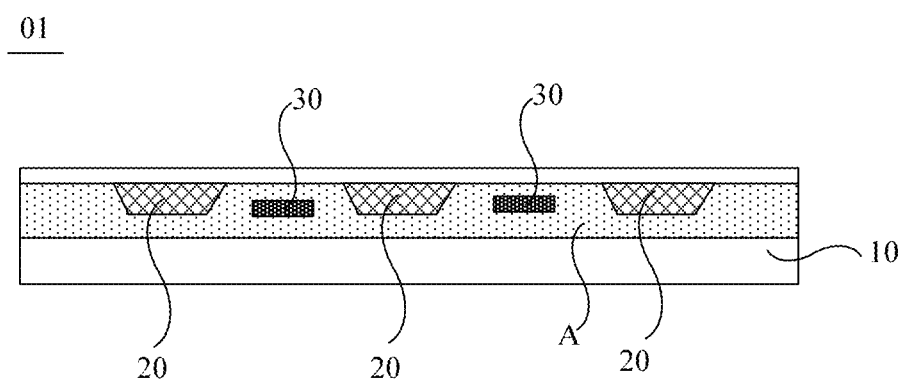
FIG. 4 is a schematic cross-sectional view of another display panel according to some embodiments of the present disclosure.

Based on the above, the current compensator 30 is located around the display sub-region 100, i.e., between the adjacent two display sub-regions 100. In this case, in order to prevent the display panel from being broken, cracked or fractured during the bending or stretching process, no inorganic insulating layer or entire metal layer is disposed on a side of the current compensator 30 near the flexible substrate 10, or on a side of the current compensator 30 away from the flexible substrate 10. Alternatively, as shown in FIG. 4, when there is an insulating layer A disposed on the side of the current compensator 30 near the flexible substrate 10, or on the side of the current compensator 30 away from the flexible substrate 10, the insulating layer A is made of an organic material. In this way, when the flexible display panel is bent, break, crack or fracture of the flexible display panel that is caused by the presence of the inorganic insulating layer is avoided. In addition, as an inorganic insulating layer is not disposed on the side of the current compensator 30 near the flexible substrate 10 or on the side of the current compensator 30 away from the flexible substrate 10, and an organic insulating layer is provided, the flexible display panel has a good flexibility in the strain region, such that the current compensator 30 can accurately sense the tensile deformation, or stretch deformation, of the flexible substrate 10 during the bending of the flexible display panel 01, and thus can provide an accurate compensation current to the light emitting device 20 electrically connected to the current compensator 30.

As can be seen from the above, the display panel 01 includes a plurality of current compensators 30, and one display sub-region 100 corresponds to at least one current compensator 30 around the display sub-region 100.

In this case, each current compensator 30 can be electrically connected to the light emitting device 20 in each of the sub-pixels 101 in the display sub-region 100 corresponding thereto. In this way, after the display panel 01 is stretched, the display area 02 of the display panel 01 increases, but the number of OLEDs in the display panel 01 still does not increase. However, with the current compensator 30 located in the peripheral region 200 of the corresponding display sub-region 100 and electrically connected to the light emitting devices 20 in the display sub-region 100, the current compensator 30 performs a current compensation to the light emitting devices 20 in the display sub-region 100 corresponding to the current compensator 30, based on the tensile deformation of the flexible substrate 10. Accordingly, the current flowing through the light emitting devices 20 is increased, thereby achieving the purpose of improving the brightness of the light emitting devices 20. Thus, after the display area of the display panel 01 is increased, the overall brightness of the display panel 01 is still the same or approximately the same as that before the stretching.

Further, since the position and direction of the applied tensile force are different in the process of stretching the display panel 01, the forces exerted at different positions in the peripheral region of the each sub-display region 100 of the display panel 01 are not completely the same. In this case, if one current compensator 30 corresponds to one display sub-region 100, the amount of deformation of the position where the current compensator 30 is located does not truly reflect the amount of deformation of the corresponding display sub-region 100.

Figure 2B:
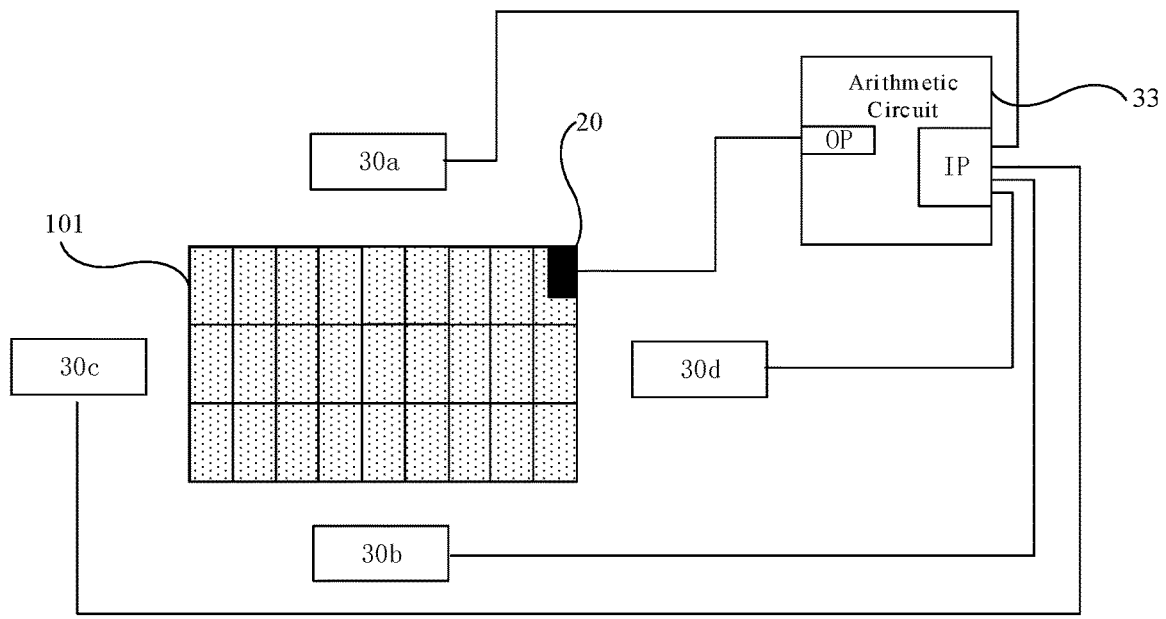
FIG. 2b is a schematic top view of another display panel according to some embodiments of the present disclosure.

In order to solve the above problem, in some embodiments of the present disclosure, as shown in FIG. 2b, at least two of the current compensators 30 are disposed around a display sub-region 100, and the at least two current compensators 30 are arranged at different positions in the peripheral region of the display sub-region 100.

For example, a first current compensator 30a, a second current compensator 30b, a third current compensator 30c, and a fourth current compensator 30d are provided on the upper side, the lower side, the left side, and the right side of the display sub-region, respectively.

In this case, during the stretching of the display panel 01, the first current compensator 30a, the second current compensator 30b, the third current compensator 30c, and the fourth current compensator 30d may generate compensation currents based on the tensile deformation of the flexible substrate 10 on the upper side, the lower side, the left side, and the right side of the display sub-region 100, respectively.

In this case, for each display sub-region 100, the display panel 01 may further include an arithmetic circuit 33 located in the display area 02. The arithmetic circuit 33 is provided in the peripheral region of the display sub-region 100.

In addition, the input terminal IP of the arithmetic circuit 33 is electrically connected to at least two of the current compensators around the display sub-region 100, that is, at least two of the first current compensator 30a, the second current compensator 30b, the third current compensator 30c, and the fourth current compensator 30d. The output terminal OP of the arithmetic circuit 33 is electrically connected to the light emitting device 20 in each sub-pixel of the display sub-region 100.

The arithmetic circuit 33 is configured to acquire an average compensation current, or the average current of the compensation currents provided by the at least two current compensators, that is, at least two of the first current compensator 30a, the second current compensator 30b, the third current compensator 30c, and the fourth current compensator 30d; and to supply the average compensation current to the light emitting device 20.

For example, when the compensation currents generated by the first current compensator 30a, the second current compensator 30b, the third current compensator 30c, and the fourth current compensator 30d are I1, I2, I3, and I4, respectively, the compensation current supplied to the light emitting device 20 by the above arithmetic circuit 33 is (I1+I2+I3+I4)/4.

In this way, the current compensators 30 are disposed on the upper, lower, left, and right sides of the display sub-region. During the stretching process of the display panel 01, even if the forces around the display sub-region 100 are different, the current compensators at different positions can generate different compensation currents according to the actual deformation amount at their respective positions. On this basis, the arithmetic circuit 33 electrically connected to each of the current compensators 30 can average the different compensation currents and supply the averaged compensation current to the light emitting device 20 in the corresponding display sub-region 100, so that the brightness compensation effect of the light emitting device 20 is close to the actual tensile deformation. Thereby, the accuracy of current compensation by the current compensators 30 for each of the light emitting devices 20 in the corresponding display sub-region 100 is improved.

Figure 5:
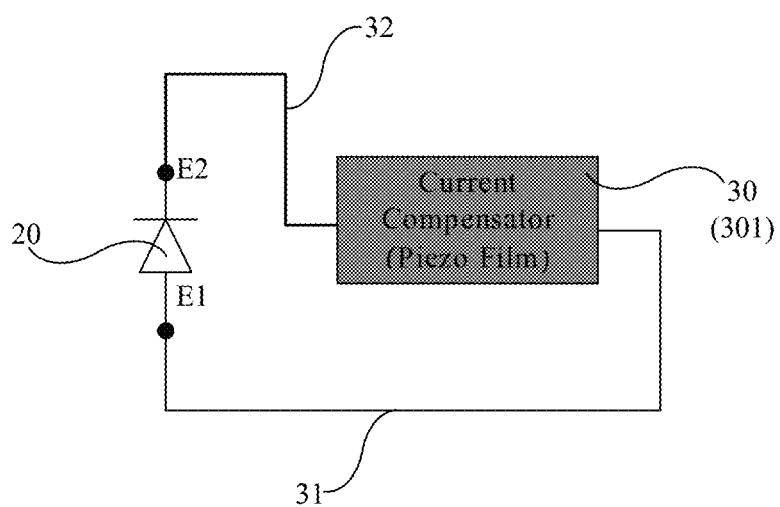
FIG. 5 is a schematic diagram of a connection between a current compensator and a light emitting device according to some embodiments of the present disclosure.
Figure 6:
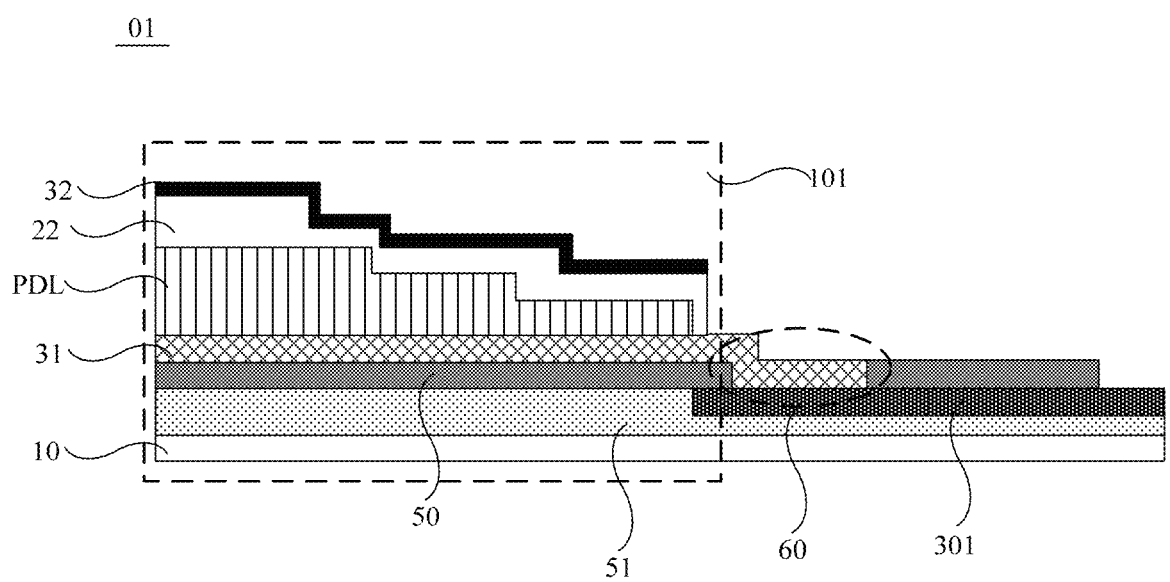
FIG. 6 is a schematic cross-sectional view of another display panel according to some embodiments of the present disclosure.

In some embodiments of the present disclosure, the current compensator 30 includes a piezo film 301 as shown in FIG. 5. In this case, the display panel 01 further includes a plurality of first leads 31 and a plurality of second leads 32, which are insulated from each other and arranged as shown in FIG. 6.

A first end of the piezo film 301 is electrically connected to a first electrode E1 of the light emitting device 20 through a first lead 31, and a second end of the piezo film 301 is electrically connected to a second electrode E2 of the light emitting device 20 through a second lead 32. Here, the first electrode E1 of the light emitting device 20 is in a layer closer to the flexible substrate 10 with respect to the second electrode E2.

It should be noted that the first electrode E1 of the light emitting device 20 may be an anode, and the second electrode E2 may be a cathode. Alternatively, the first electrode E1 is a cathode and the second electrode E2 is an anode. This disclosure does not limit this. For convenience of explanation, the following description is made by taking the first electrode E1 of the light emitting device 20 as an anode and the second electrode E2 as a cathode.

The piezo film 301 may deform under an external force, and the deformation changes the electrical properties of the piezo film 301. In this case, since the first end and the second end of the piezo film 301 are electrically connected to the first and second electrodes E1, E2 of the light emitting device 20 through the first lead 31 and the second lead 32, respectively, when an electrical property of the piezo film 301 is changed, the current flowing through the light emitting device 20 is also changed, thereby achieving the purpose of compensating for the luminance or brightness of the light emitting device 20.

In some embodiments of the present disclosure, the first lead 31 and the second lead 32 are insulated from each other, and may be fabricated by the same patterning process. In this case, the first lead 31 and the second lead 32 are of the same material, but any two adjacent first leads 31 and second leads 32 do not overlap.

Alternatively, in some other embodiments of the present disclosure, in order to insulate the first lead 31 from the second lead 32, the first lead 31 and the second lead 32 may also be disposed in different layers, and an insulating layer is provided between the first lead 31 and the second lead 32. The insulating layer may be formed of an organic insulating material. In this case, the first lead 31 and the second lead 32 are formed by two patterning processes respectively.

It should be noted that, in some embodiments of the present disclosure, the patterning process may include a mask process, or include a photolithography process and an etching process, and may also include other process of forming a predetermined pattern such as printing, inkjet, etc. A photolithography process refers to a process of forming a pattern by using a photoresist, a mask, an exposure machine, or the like, including a process of film formation, exposure, development, and the like. A corresponding patterning process may be selected based on the structure to be formed.

One patterning process in the embodiment of the present disclosure is to form different exposure regions by one mask exposure process, and then perform multiple removal processes such as etching, ashing, etc. on different exposure regions to finally obtain an expected pattern.

The manner in which the piezo film 301 is disposed in the display panel 01 will be described below.

For example, as shown in FIG. 6, the display panel 01 further includes a first insulating layer 50 on the flexible substrate 10. The first insulating layer 50 is located on a side of the piezo film 301 facing away from the flexible substrate 10. The first insulating layer may be made of an organic material.

As shown in FIG. 6, a plurality of first via holes 60 are disposed on the first insulating layer 50. The first lead 31 electrically connects the first end of the piezo film 301 to the first electrode E1 of the light emitting device 20 in the Active Area (AA region) through the first via hole 60.

In some embodiments of the present disclosure, the first lead 31 may be of the same material as the first electrode E1 of the light emitting device 20. In this way, the first lead 31 can be formed while forming the first electrode E1 (for example, the anode) of the light emitting device 20 by one patterning process. Here, the first electrode E1 of the light emitting device 20 and the first lead 31 electrically connected thereto are of a unitary or integral structure.

Figure 7:
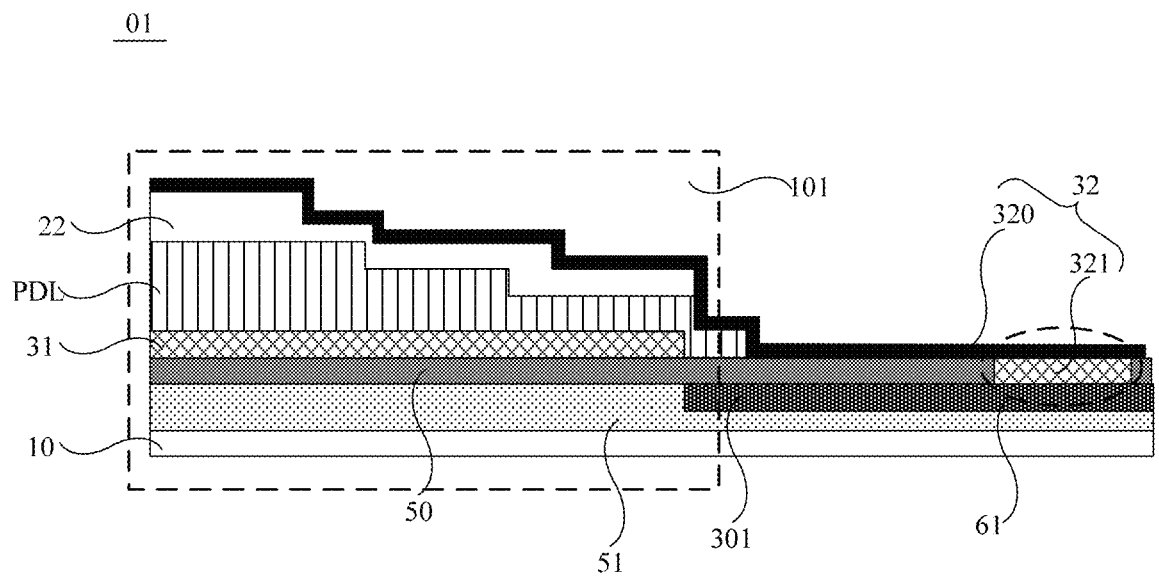
FIG. 7 is a schematic cross-sectional view of another display panel according to some embodiments of the present disclosure.

In addition, as shown in FIG. 7, a plurality of second via holes 61 are disposed on the first insulating layer 50. The second lead 32 electrically connects the second end of the piezo film 301 to the second electrode E2 of the light emitting device 20 in the Active Area (AA region) through the second via 61.

In some embodiments of the present disclosure, as shown in FIG. 7, the second lead 32 includes an adapting lead 321 and a sub-lead 320 electrically connected with each other. The adapting lead 321 is located in the second via hole 61.

In order to simplify the process, the adapting lead, or patch wire, 321 may be of the same material as the first electrode E1 of the light emitting device 20. The sub-lead 320 may be of the same material as the second electrode E2 of the light emitting device 20.

As can be seen from the above, the first lead 31 is of the same material as the anode of the light emitting device 20. The adapting lead 321 of the second lead 32 is in the same layer and of the same material as the anode of the light emitting device 20. The sub-lead 320 is in the same layer and of the same material as the cathode of the light emitting device 20. When the anode or the cathode of the light emitting device 20 is of a metal material, at least a part of the first lead 31 or the second lead 32 is made of a metal material. Since the first lead 31 and the second lead 32 have a linear structure and a small line width, they also have some flexibility. Therefore, when the display panel 01 is bent, there is a relatively low probability that the display panel 01 is broken, cracked or fractured.

In this case, a method of forming an electrical connection structure between the second lead 32 and the light emitting device 20 in the display panel 01 includes the following.

First, the first insulating layer 50 is formed. After the first insulating layer 50 is formed, the plurality of first via holes 60 and the plurality of second via holes 61 are simultaneously formed on the first insulating layer 50 by one patterning process.

Next, on the flexible substrate 10 on which the first insulating layer 50 is formed, the first electrode E1 of the light emitting device 20 is formed by a patterning process, and at the same time, the adapting lead 321 located in the second via hole 61 is formed.

Next, on the flexible substrate 10 on which the first electrode E1 of the light emitting device 20 is formed, a pixel defining layer (PDL) and an organic functional layer 22 of the light emitting device 20 are sequentially formed by a patterning process.

The organic functional layer 22 includes a hole layer, a light emitting layer, an electron layer, etc.

Next, on the flexible substrate 10 on which the organic functional layer 22 is formed, the second electrode E2 of the light emitting device 20 is formed by a patterning process, and at the same time, the sub-lead 320 that is in direct contact with the adapting lead 321 located in the second via hole 61 is formed. The sub-lead 320 is electrically connected to the second end of the piezo film 301 through the adapting lead 321.

The display panel 01 further includes a second insulating layer 51 on the flexible substrate 10. The second insulating layer 51 is located on a side of the piezo film 301 close to the flexible substrate 10. In this case, it is possible to avoid short circuit between the piezo film 301 and the conductive member on the side of the piezo film 301 close to the flexible substrate 10, for example, the conductive lead or the circuit structure. The second insulating layer may be made of an organic material.

The manner in which the piezo film 301 is disposed will be exemplified below.

In an example, the piezo film 301 is a piezoelectric film composed of a piezoelectric material. For example, the piezoelectric material includes some polymer materials, such as at least one of polyvinylidene fluoride, odd nylon, vinylene cyanide (VDCN) copolymer, aromatic and aliphatic polyurea.

In this case, when the piezoelectric film is deformed by a force, a voltage is generated at both ends of the piezoelectric film, thereby providing a compensation current to a device electrically connected to both ends of the piezoelectric film, such as the light emitting device 20.

Figure 8A:
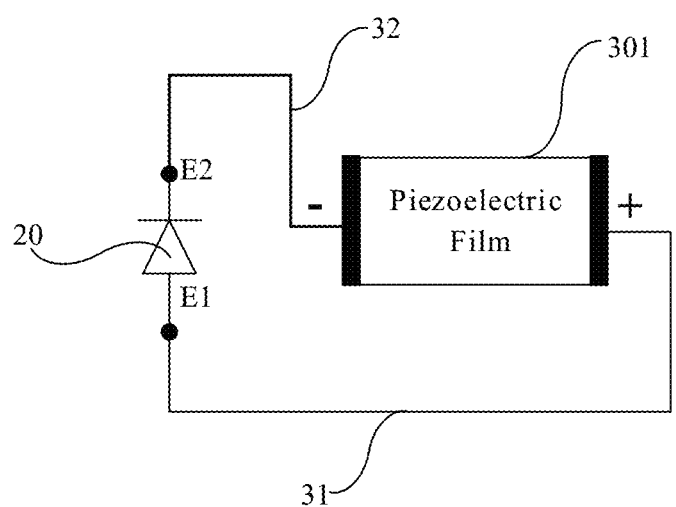
FIG. 8a is a schematic view showing a connection between a piezo film and a light emitting device according to some embodiments of the present disclosure.

In some embodiments of the present disclosure, as shown in FIG. 8a, a first end of the piezoelectric film (positive electrode "+") is electrically connected to the first electrode E1 (e.g., the anode) of the light emitting device 20, and a second end of the piezoelectric film (negative electrode "−") is electrically connected to the second electrode E2 (e.g., the cathode) of the light emitting device 20.

Figure 8B:
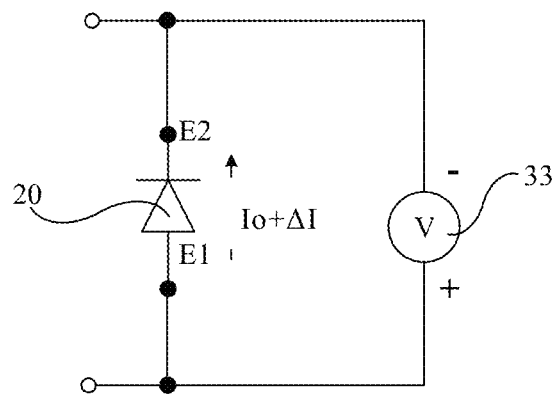

In this case, the piezoelectric film described above may correspond to a power source 33 shown in FIG. 8b. Here, the piezoelectric film is used to generate a positive compensation current $\Delta I$ in a stretched state.

After the display panel 01 is stretched, the piezoelectric film can compensate for the brightness of the light emitting device 20 electrically connected to the piezoelectric film. As shown in FIG. 8b, the compensation current $\Delta I$ provided by the piezoelectric film and the driving current Io of the light emitting device 20 (or the current Io driving the light emitting device 20 provided by the driving circuit) are in the same direction. In this way, the positive compensation current ΔI is superimposed with (or added to) the driving current Io of the light emitting device 20 (i.e., Io+ΔI), so that the current actually flowing through the light emitting device 20 is increased, thereby improving the luminance of the light emitting device 20.

Figure 9A:
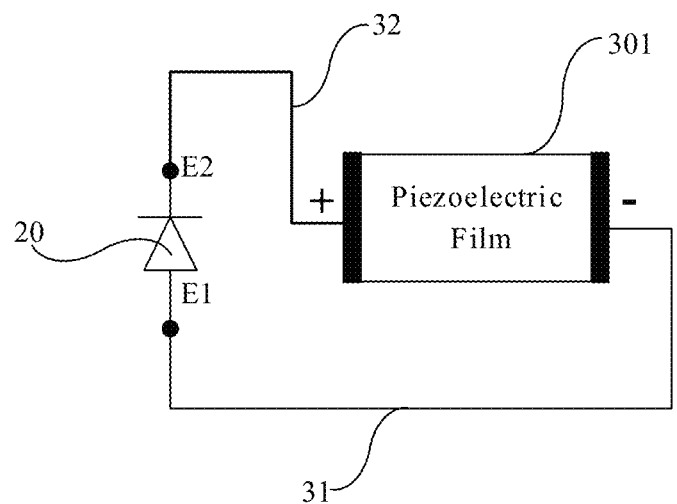
FIG. 9a is a schematic view showing a connection between another piezo film and a light emitting device according to some embodiments of the present disclosure.

In some embodiments of the present disclosure, as shown in FIG. 9a, the first end of the piezoelectric film (positive electrode "+") is electrically connected to the second electrode E2 (e.g., cathode) of the light emitting device 20, and the second end of the piezoelectric film (negative electrode "–") is electrically connected to the first electrode E1 (e.g., the anode) of the light emitting device 20.

Figure 9B:
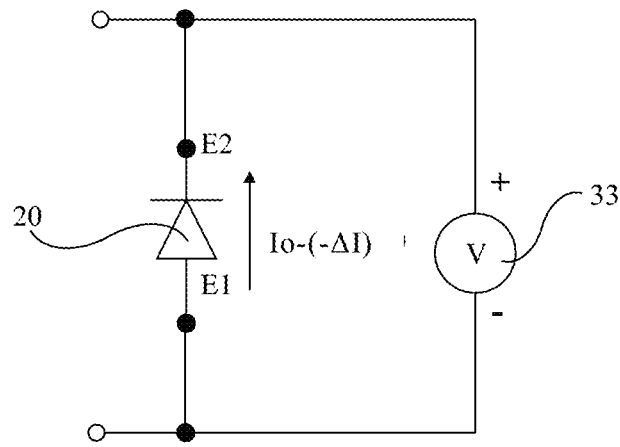

In this case, the piezoelectric film may correspond to a power source 33 shown in FIG. 9b. Here, the piezoelectric film is used to generate a negative compensation current –ΔI in a stretched state.

After the display panel 01 is stretched, the piezoelectric film can compensate for the brightness of the light emitting device 20 electrically connected to the piezoelectric film. As shown in FIG. 9b, the negative compensation current –ΔI provided by the piezoelectric film and the driving current Id of the light emitting device 20 (or the current Id driving light emitting device 20) are in opposite directions. In this way, the negative compensation current –ΔI is subtracted from the driving current Io of the light emitting device 20 (i.e., Io−(−ΔI)=Io+ΔI), and the current actually flowing through the light emitting device 20 is increased, thereby achieving improved brightness of the light emitting device 20.

Further, in some embodiments of the present disclosure, the piezoelectric film may have a thickness of 0.1 μm to 1 μm. When the thickness of the piezoelectric film is less than 0.1 μm, after the piezoelectric film is deformed, the voltage generated across the two ends thereof is small, so that the compensation current ΔI provided to the light emitting device 20 electrically connected to both ends of the piezoelectric film is small, thereby reducing the effect of brightness compensation or luminance compensation.

When the thickness of the piezoelectric film is larger than 1 μm, the compensation current ΔI supplied to the light emitting device 20 after the piezoelectric film is deformed is relatively large, so that the overall brightness of the display panel 01 after the luminance compensation is excessively increased. This will cause the display panel to be too bright, and make the brightness difference before and after the stretching of the display panel 01 relatively large, degrading the display effect.

Thus, in some embodiments of the present disclosure, the piezoelectric film may have a thickness of 0.1 μm, 0.2 μm, 0.5 μm, 0.8 μm, or 1 μm.

In an example, the piezo film 301 is a piezoresistive film, which may be at least one of a polymer material, a carbon nanotube, or a nickel-iron alloy.

In this case, when the piezoresistive film is deformed under a force, the resistance of the piezoresistive film itself changes, so that the voltage across the device connected with the piezoresistive film in parallel, for example, the voltage across the two ends of the light emitting device 20, changes to achieve the purpose of changing the current flowing through the light emitting device 20. In an embodiment, the resistance of the piezoresistive film increases in a stretched state.

Figure 10A:
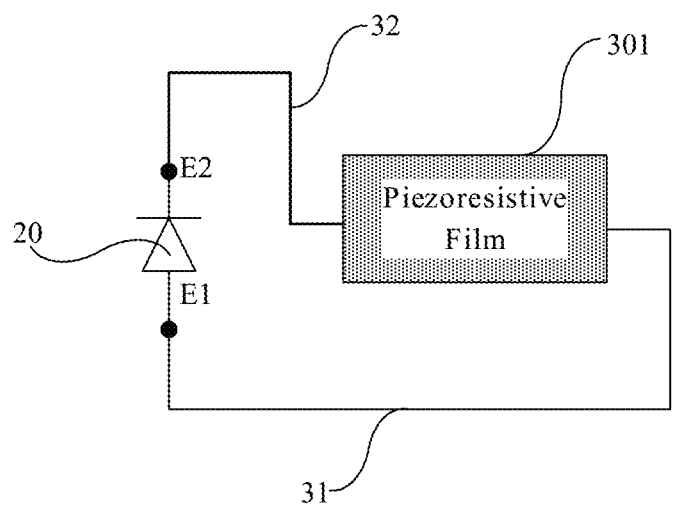
FIG. 10a is a schematic view showing a connection of another piezo film and a light emitting device according to some embodiments of the present disclosure.

The piezoresistive film, as shown in FIG. 10a, may be patterned into a block area, or a laminar shape, or may be provided as a sheet.

Figure 10B:
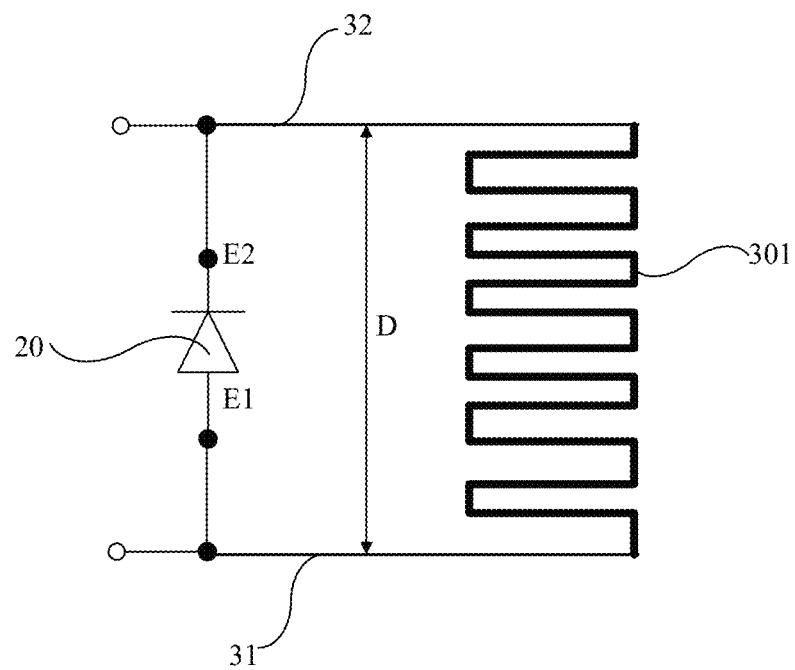
FIG. 10b is a schematic view showing a connection of another piezo film and a light emitting device according to some embodiments of the present disclosure.
Figure 10C:
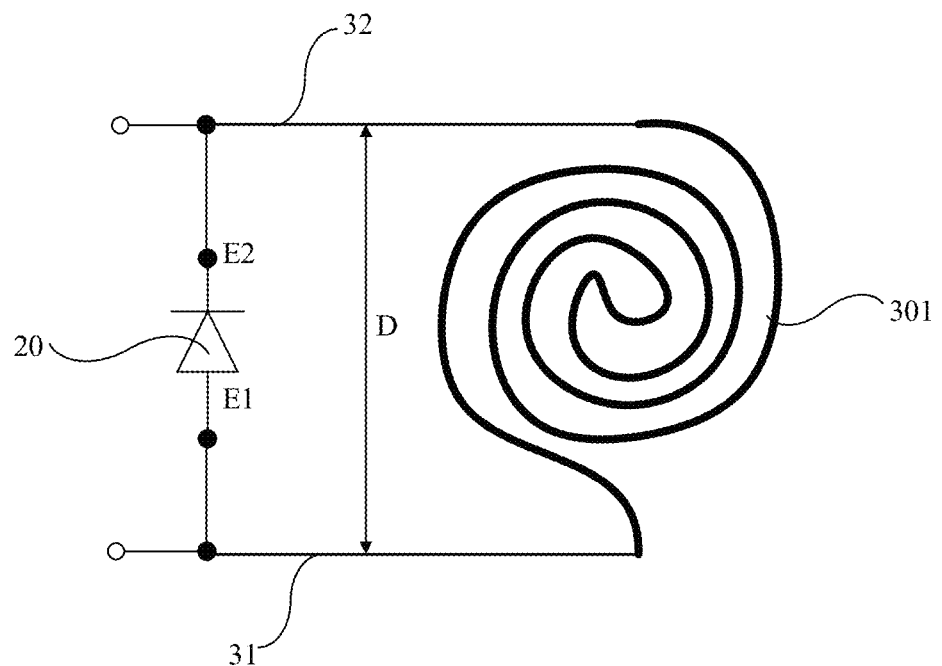
FIG. 10c is a schematic view showing a connection of another piezo film and a light emitting device according to some embodiments of the present disclosure.

Alternatively, the piezoresistive film, as shown in FIG. 10b or FIG. 10c, may be in the form of a line.

For example, in FIG. 10b, the wiring path of the piezoresistive film line or the piezoresistive lead extends horizontally to the left (or right), and extends vertically downward (or upward). It then extends horizontally to the right (or left). The path is then continuously repeated to form a comb-shaped structure or a square-wave-shaped structure as shown.

For example, the wiring path of the piezoresistive lead may be a pattern like double spirals as shown in FIG. 10c, with one end in contact with the second lead 32 and the other end in contact with the first lead 31. The line spirals inward from both ends, forming a pattern similar to Fermat's spiral. There is no intersection of line segments of the piezoresistive lead.

Here, a length of the piezoresistive lead is greater than a distance D between the orthographic projection of the first lead 31 on the flexible substrate 10 and the orthographic projection of the second lead 32 on the flexible substrate 10. The piezoresistive lead is in a curved or bent state, and the more the bends in the piezoresistive lead, the greater is the resistance of the piezoresistive lead. In this way, compared with the piezoresistive film in a block-like structure, or with a block area, a linear structure, i.e. a piezoresistive lead solution, may result in a relatively large resistance obtained in a smaller area occupied by the piezoresistive film.

It should be noted that FIG. 10b and FIG. 10c are only examples of the curved wiring path of the piezoresistive film line, and other possible wiring manners of the piezoresistive film line will not be further described herein.

Figure 10D:
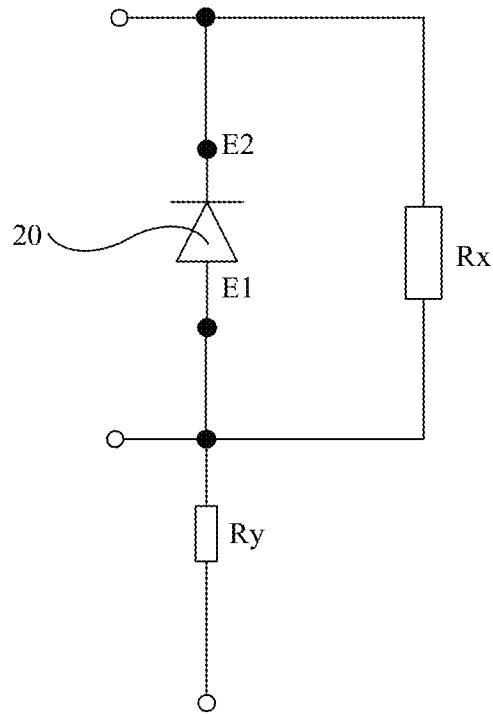
FIG. 10d is an equivalent circuit diagram of FIG. 10a, FIG. 10b or FIG. 10c.

Here, the piezoresistive film may be equivalent to a resistor Rx shown in FIG. 10d. The resistor Rx is connected with the light emitting device 20 in parallel. For example, the resistance of the driving circuit 21 (shown in FIG. 3a or FIG. 3b) for driving the light emitting device 20 in the pixel circuit in the sub-pixel 101 is Ry. In this way, when the display panel 01 is stretched, the resistance Rx of the piezoresistive film is increased and the voltage applied across both ends of the light emitting device 20 in the pixel circuit in FIG. 10d is increased, so that the current flowing through the light emitting device 20 is increased, achieving improved overall brightness of the display panel 01.

In some embodiments of the present disclosure, the piezoresistive film has a resistance value of 100 kΩ to 10 MΩ. When the resistance value is less than 100 kΩ, after the piezoresistive film is stretched, the resistance increase of the piezoresistive film is small, so that the voltage increase across both ends of the light emitting device 20 connected in parallel with the piezoresistive film is small. Thus, the current flowing through the light emitting device 20 is small, reducing the effect of brightness compensation.

When the resistance value of the piezoresistive film is greater than 10 MΩ, after the piezoresistive film is stretched, its resistance increase is relatively large, so that the voltage increase across both ends of the light emitting device 20 connected in parallel with the piezoresistive film is also relatively large. Thus, the current flowing through the light emitting device 20 is large, causing the display panel to be too bright. In this case, the brightness difference before and after the stretching of the display panel 01 is large, degrading the display effect.

Based on this, in some embodiments of the present disclosure, the resistance of the piezoresistive film may be 100 kΩ, 200 kΩ, 500 kΩ, 800 kΩ, 10 MΩ.

Further, the thickness of the piezoresistive film may be from 0.1 μm to 1 μm. The beneficial effect of this thickness range of the piezoresistive film is the same as the beneficial effect achieved by the thickness range of the piezoelectric film, and will not be described herein.

In some embodiments, there is provided a display panel, comprising: a flexible substrate; wherein a display area of the display panel is divided into a plurality of display sub-regions, each of the display sub-regions being provided with at least one sub-pixel; wherein the display panel further includes a plurality of light emitting devices and a plurality of current compensators disposed on the flexible substrate; wherein each sub-pixel has one of the light emitting devices; at least one of the current compensators is disposed in a peripheral region of each display sub-region; the light-emitting device in each sub-pixel of each display sub-region is electrically connected to the at least one of the current compensations disposed in the peripheral region of the display sub-region; and the current compensators are configured to compensate a current flowing through the light emitting devices according to a tensile deformation of the flexible substrate.

Some embodiments of the present disclosure provide a display device including any of the display panels 01 as described above.

The display device is a flexible display device, and the display device may be a bendable or stretchable device having a display function, such as a television, a mobile phone, a tablet computer, a vehicle-mounted computer, and a display canvas. The display device achieves the same technical effects as the display panel 01 provided in the foregoing embodiments, and thus details are not described herein again.

Some embodiments of the present disclosure provide a method of manufacturing the display panel 01.

Figure 11:
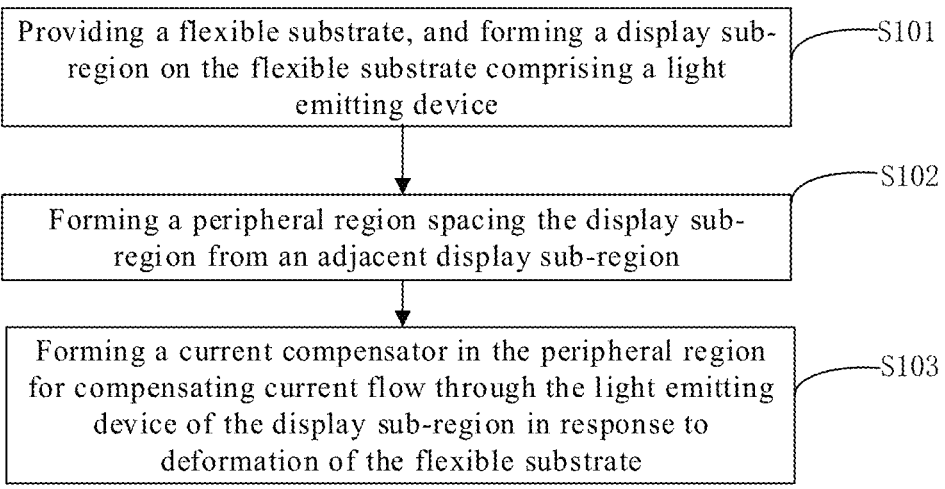
FIG. 11 is a flow chart of a method of manufacturing a display panel according to some embodiments of the present disclosure.

As shown in FIG. 11, the method includes: S101 providing a flexible substrate 10, and forming a display sub-region 100 on the flexible substrate comprising a light emitting device 20; S102 forming a peripheral region 200 spacing the display sub-region from an adjacent display sub-region; and S103 forming a current compensator 30 in the peripheral region for compensating a current flowing through the light emitting device 20 of the display sub-region 100 in response to deformation of the flexible substrate 10.

In some embodiments of the present disclosure, in the case that the current compensator 30 includes a piezo film 301, the method of manufacturing the display panel 01 further includes:

forming a first insulating layer 50 on the flexible substrate 10 on which the piezo film 301 is formed;

forming a first via hole 60 and a second via hole 61 on the first insulating layer 50 by a patterning process;

forming a first lead 31 while forming a first electrode E1 of the light emitting device 20, where the first lead 31 electrically connects a first end of the piezo film and the first electrode E1 of the light emitting device through the first via hole 60; and forming a second lead 32 comprising an adapting lead 321 and a sub-lead 320, where the second lead 32 is formed by: forming the adapting lead 321 in the second via hole 61 while forming the first electrode E1 of the light emitting device 20, and forming the sub-lead 320 electrically connected to the adapting lead 321 while forming a second electrode E2 of the light emitting device 20, and the second lead 32 electrically connects a second end of the piezo film 301 to the second electrode E2 of the light emitting device 20 through the second via hole 61.

In this way, the first lead 31 is formed by the same patterning process as the first electrode (e.g. the anode) of the light emitting device 20; the adapting lead 321 is also formed by the same patterning process as the anode of the light emitting device 20; and the sub-lead 320 is formed by the same patterning process as the second electrode (e.g. the cathode) of the light emitting device 20, thereby facilitating the inspection of the manufacturing process.

The manufacturing method of the display panel 01 achieves the same technical effects as the display panel provided in the foregoing embodiments, and details are not described herein again.

With reference to FIG. 2a, FIGS. 3a-3b and FIG. 4, a method of manufacturing the display panel 01 according to some embodiments may include:

in a display area 02 of the display panel 01, forming at least one current compensator 30 on a flexible substrate 10 by a patterning process in a peripheral region of each display sub-region 100;

in the display area 02 of the display panel 01, forming a light emitting device 20 by a patterning process in each sub-pixel 101 of each display sub-region 100; and in each display sub-region 100, electrically connecting the light emitting device 20 in each sub-pixel 101 to at least one current compensator 30 in the peripheral region of the display sub-region 100.

The current compensator 30 is configured to compensate a current flowing through the light emitting device 20 based on a tensile deformation of the flexible substrate 10.

Insulation is provided between any two current compensators 30 that are connected.

In some embodiments of the present disclosure, in the case that the current compensator 30 includes a piezo film 301, forming at least one current compensator 30 includes:

in the display area 02 of the display panel 01, forming at least one piezo film 301 on the flexible substrate 10 by a patterning process in the peripheral region of each display sub-region 100.

After forming the at least one piezo film 301 on the flexible substrate 10, the method of manufacturing the display panel 01 according to some embodiments further includes:

on the flexible substrate 01 on which the piezo film 301 is formed, forming a first insulating layer 50 as shown in FIG. 6 or FIG. 7, and forming a plurality of first via holes 60 on the first insulating layer 50 by a patterning process;

on the flexible substrate on which the first insulating layer 50 is formed, forming a first electrode E1 of the light emitting device 20, such as an anode, by a patterning process; and forming a first lead 31 while forming the first electrode E1 of the light emitting device 20.

In this case, the first lead 31 is electrically connected to the first electrode E1 of the light emitting device 20, for example, the anode, through the first via hole 60.

In this way, the first lead 31 is formed by the same patterning process as the anode of the light emitting device 20, which is advantageous for the inspection of the manufacturing process.

In addition, the method of manufacturing the display panel 01 further includes:

forming a plurality of second via holes 61 as shown in FIG. 7 while forming a plurality of first via holes 60 on the first insulating layer 50 by the patterning process.

In this way, the plurality of first via holes 60 and the plurality of second via holes 61 located on the first insulating layer 50 can be formed by the same patterning process.

An adapting lead 321 is formed in the second via hole 61 while forming the first electrode E1 of the light emitting device 20.

In addition, on the flexible substrate 01 on which the first electrode E1 of the light emitting device 20, for example an anode, is formed, a second electrode E2 of the light emitting device 20, such as a cathode, is formed by a patterning process.

It should be noted that, before forming the cathode of the light emitting device 20 on the flexible substrate 01 on which the anode of the light emitting device 20 is formed, the method of manufacturing the display panel 01 further includes sequentially forming a PDL on the side of the anode of the light emitting device 20 away from the flexible substrate 01 and an organic functional layer 22 by a patterning process.

In addition, while forming the second electrode E2 of the light emitting device 20, for example, a cathode, a sub-lead 320 may be formed as shown in FIG. 7, where the sub-lead 320 is electrically connected to the adapting lead 321.

The second lead 32 includes the sub-lead 320 and the adapting lead 321.

In this case, the adapting lead 321 of the second lead 32 is located in the second via hole 61, and the sub-lead 320 of the second lead 32 is in direct contact with the adapting lead 321. Therefore, the second lead 32 electrically connects the second end of the piezo film 301 to the second electrode E2 of the light emitting device 20, such as a cathode, through the second via hole 61.

As can be seen from the above, the adapting lead 321 can be formed by the same patterning process as the anode of the light emitting device 20. In addition, the sub-lead 320 can be formed by the same patterning process as the cathode of the light emitting device 20, which is advantageous for the inspection of the manufacturing process.

Of course, for related contents in the manufacturing method, reference may be made to the corresponding part in the foregoing embodiments of the display panel, and the details are not described herein again. For other configuring structures in the foregoing embodiments of the display panel, an appropriate manufacturing method may be selected for production, and the details will not be repeated here.

Various embodiments and/or examples are disclosed to provide exemplary and explanatory information to enable a person of ordinary skill in the art to put the disclosure into practice. Features or components disclosed with reference to one embodiment or example are also applicable to all embodiments or examples unless specifically indicated otherwise.

Although the disclosure is described in combination with specific embodiments, it is to be understood by the person skilled in the art that many changes and modifications may be made and equivalent replacements may be made to the components without departing from a scope of the disclosure. Embodiments may be practiced in other specific forms. The described embodiments are to be considered in all respects only as illustrative and not restrictive.

What is claimed is:

1. A display panel, comprising:
a flexible substrate;
a display sub-region on the flexible substrate comprising a light emitting device;
a peripheral region of the display sub-region spacing the display sub-region from an adjacent display sub-region;
a current compensator in the peripheral region for compensating a current flowing through the light emitting device of the display sub-region in response to deformation of the flexible substrate, wherein the display panel further comprises a plurality of current compensators in the peripheral region; and
an arithmetic circuit configured to acquire an average compensation current of at least two of the current compensators, and to supply the average compensation current to the light emitting device.

2. The display panel according to claim 1, further comprising a plurality of the display sub-regions in an array arrangement, and a plurality of the peripheral regions, each spacing one of the display sub-regions from an adjacent display sub-region.

3. The display panel according to claim 2, wherein each display sub-region comprises a single sub-pixel with one light emitting device electrically connected to the current compensator.

4. The display panel according to claim 2, wherein each display sub-region comprises a plurality of sub-pixels, each having a light emitting device electrically connected to the current compensator.

5. The display panel according to claim 1, wherein the current compensator comprises a piezo film.

6. The display panel according to claim 5, further comprising a first lead and a second lead insulated from each other;
wherein a first end of the piezo film is electrically connected to a first electrode of the light emitting device through the first lead, and a second end of the piezo film is electrically connected to a second electrode of the light emitting device through the second lead; and
the first electrode of the light emitting device is closer to the flexible substrate with respect to the second electrode of the light emitting device.

7. The display panel according to claim 6, further comprising a first insulating layer on the flexible substrate, the first insulating layer being located on a side of the piezo film away from the flexible substrate;
a first via hole on the first insulating layer, wherein the first lead electrically connects the first end of the piezo film to the first electrode of the light emitting device through the first via hole; and
a second via hole on the first insulating layer, wherein the second lead electrically connects the second end of the piezo film to the second electrode of the light emitting device through the second via hole.

8. The display panel according to claim 7, wherein
the second lead includes an adapting lead and a sub-lead electrically connected with each other, the adapting lead being in the second via hole;
the adapting lead is of a same material as the first electrode of the light emitting device; and
the sub-lead is of a same material as the second electrode of the light emitting device.

9. The display panel according to claim 6, wherein the piezo film is a piezoelectric film.

10. The display panel according to claim 9, wherein the piezoelectric film is configured to generate a positive compensation current in a stretched state, a first end of the piezoelectric film is electrically connected to the first electrode of the light emitting device, and a second end of the piezoelectric film is electrically connected to the second electrode of the light emitting device;
wherein the positive compensation current is in a same direction as a current driving the light emitting device.

11. The display panel according to claim 9, wherein the piezoelectric film is configured to generate a negative compensation current in a stretched state, a first end of the piezoelectric film is electrically connected to the second electrode of the light emitting device, and a second end of the piezoelectric film is electrically connected to the first electrode of the light emitting device;

wherein the negative compensation current is in a direction opposite to a current driving the light emitting device.

12. The display panel according to claim 6, wherein the piezo film is a piezoresistive film that has an increased resistance in a stretched state.

13. The display panel according to claim 12, wherein the piezoresistive film is patterned into a block area.

14. The display panel according to claim 12, wherein the piezoresistive film is a piezoresistive lead; and a length of the piezoresistive lead is greater than a distance between orthographic projections of the first lead and the second lead on the flexible substrate.

15. The display panel according to claim 7, wherein the display panel further comprises a second insulating layer on the flexible substrate, the second insulating layer being located on a side of the piezo film close to the flexible substrate.

16. The display panel of claim 15, wherein at least one of the first and second insulating layers is made of an organic material.

17. A display device, comprising a display panel, wherein the display panel comprises:

a flexible substrate;

a display sub-region on the flexible substrate comprising a light emitting device;

a peripheral region of the display sub-region spacing the display sub-region from an adjacent display sub-region;

a current compensator in the peripheral region for compensating a current flowing through the light emitting device of the display sub-region in response to deformation of the flexible substrate, wherein the display panel further comprises a plurality of current compensators in the peripheral region; and an arithmetic circuit configured to acquire an average compensation current of at least two of the current compensators, and to supply the average compensation current to the light emitting device.

18. A method of manufacturing a display panel, comprising:

providing a flexible substrate;

forming a display sub-region on the flexible substrate comprising a light emitting device;

forming a peripheral region of the display sub-region spacing the display sub-region from an adjacent display sub-region;

forming a current compensator in the peripheral region for compensating a current flowing through the light emitting device of the display sub-region in response to deformation of the flexible substrate, and forming a plurality of current compensators in the peripheral region; and providing an arithmetic circuit configured to acquire an average compensation current of at least two of the current compensators, and to supply the average compensation current to the light emitting device.

19. The method according to claim 18, wherein the current compensator comprises a piezo film; and the method further comprises:

forming a first insulating layer on the flexible substrate on which the piezo film is formed;

forming a first via hole and a second via hole on the first insulating layer by a patterning process;

forming a first lead while forming a first electrode of the light emitting device, wherein the first lead electrically connects a first end of the piezo film and the first electrode of the light emitting device through the first via hole; and forming a second lead comprising an adapting lead and a sub-lead;

wherein the second lead is formed by: forming the adapting lead in the second via hole while forming the first electrode of the light emitting device, and forming the sub-lead electrically connected to the adapting lead while forming a second electrode of the light emitting device; and the second lead electrically connects a second end of the piezo film to the second electrode of the light emitting device through the second via hole.

* * * * *